United States Patent
Rose et al.

[11] Patent Number: 6,068,884
[45] Date of Patent: May 30, 2000

[54] METHOD OF MAKING LOW κ DIELECTRIC INORGANIC/ORGANIC HYBRID FILMS

[75] Inventors: Peter Rose, Boulder Creek; Eugene Lopata, Scotts Valley; John Felts, Alameda, all of Calif.

[73] Assignee: Silcon Valley Group Thermal Systems, LLC, Scotts Valley, Calif.

[21] Appl. No.: 09/067,704

[22] Filed: Apr. 28, 1998

[51] Int. Cl.⁷ .............................. C23C 16/00; C08J 7/04
[52] U.S. Cl. ................. 427/255.6; 427/515; 427/578; 427/99
[58] Field of Search ................. 427/578, 515, 427/99, 255.6, 255.7

[56] References Cited

U.S. PATENT DOCUMENTS

| | | | |
|---|---|---|---|
| 4,168,330 | 9/1979 | Kaganowicz | 427/39 |
| 5,290,736 | 3/1994 | Sato et al. | 437/238 |
| 5,508,368 | 4/1996 | Knapp et al. | 427/534 |
| 5,618,619 | 4/1997 | Petrmichl et al. | 428/334 |
| 5,679,413 | 10/1997 | Petrmichl et al. | 427/534 |

OTHER PUBLICATIONS

Inoue et al, Plasma Sources Sci. Technol. 5(2) Abstract (pp. 339–343), 1996 No Month Data!.

Sahli et al, Mater. Chem. Phys. 33(1–2) Abstract (pp. 106–109), 1993 No Month Data!.

C. Rau et al., "Mechanisms of plasma polymerization of various silico–organic monomers", Thin Solid Films, pp. 28–37, 249 (1994) No Month Data!.

S. Sahli et al., "Properties of plasma–polysiloxane deposited by PECVD", Materials Chemistry and Physics, pp. 106–109, 33 (1993) No Month Data!.

A.R. McCabe et al., "Large Area Diamond–like Carbon Coatings by Ion Implantation", Surface Engineering vol. III: Process Technology and Surface Analysis, pp. 163–172, 1995 No Month Data!.

A.M. Wróbel et al., "Ollgomeric Products in Plasma–Polymerized Organosilicones", J. Macromol. Sci–Chem., A20(5&6), pp. 583–618 (1983) No Month Data!.

Y. Osada et al., "Plasma–Exposed Polymerization Of Cyclic Organosiloxanes In The Condensed Phase", Journal of Polymer Science: Polymer Letters Edition, vol. 19, 369–374 (1981) No Month Data!.

P. Favia et al., "The role of substrate temperature and bias in the plasma deposition from tetramethylsilane", Plasma Sources Sci. Technol. 1 (1992) pp. 59–66 No Month Data!.

D.S. Kim et al., "Deposition of thermally stable, low dielectric constant fluorocarbon/$SiO_2$ composite thin film", American Institute of Physics, Appl. Phys. Lett., vol. 69, No. 18, Oct. 28, 1996, pp. 2776–2778.

V. Hazari et al., Characterization of Alternative Chemistries for Depositing PECVD Silicon Dioxide Films, DUMIC Conference, IMIC—333D/98/0319, pp. 319–326, Feb. 1998.

P. Favia, "Plasma Deposition of Thin Films from a Fluorine–Containing Cyclosiloxane", Journal of Polymer Science: Part A: Polymer chemistry, 1992, 0 pages No Month Data.

M. R. Wertheimer et al., "Advances In Basic and Applied Aspects Of Microwave Plasma Polymerization", Thin Solid Films, 115 (1984) pp. 109–124 No Month Data.

J.A. Theil et al., "Carbon content of silicon oxide films deposited by room temperature plasma enhanced chemical vapor deposition of hexamethyldisiloxane and oxygen", Journal of Vacuum Science Technology, A 12(4), Jul./Aug. 1994, pp. 1365–1370.

(List continued on next page.)

*Primary Examiner*—Roy V. King
*Attorney, Agent, or Firm*—Flehr Hohbach Test Albritton & Herbert

[57] ABSTRACT

A method of depositing a dielectric film exhibiting a low dielectric constant in a semiconductor and/or integrated circuit by chemical vapor deposition (CVD) is provided. The film is deposited using an organosilicon precursor in a manner such that the film is comprised of a backbone made substantially of Si—O—Si or Si—N—Si groups with organic side groups attached to the backbone.

34 Claims, 5 Drawing Sheets

OTHER PUBLICATIONS

N. Inagaki et al., "Plasma Polymerization of Organosilicon Compounds", Journal of Applied Polymer Science, vol. 30, pp. 3385–3395 No Month Data.

Y. Segui et al., "In Situ Electrical Property Measurements Of Metal (Plasma Polysiloxane)/Metal Structures", Thin Solid Films, 155 (1987) pp. 175–185, Electronics and Optics No Month Data.

Y. Segui et al. "Gas Discharge In Hexamethyldisiloxane", Journal of Applied Polymer Science, vol. 20, pp. 1611–1618 (1976) No Month Data.

N. Inagaki et al., "Preparation of Siloxane–Like Films by Glow Discharge Polymerization", Journal of Applied Polymer Science, vol. 29, pp. 3595–3605 (1984) No Month Data.

V.S. Nguyen et al., "Plasma Organosilicon Polymers", J. Electrochem. Soc. Solid–State Science and Technology, vol. 132, No. 8, pp. 1925–1932, Aug. 1985.

K. J. Taylor et al., "Parylene Copolymers", Spring MRS, Symposium N, pp. 1–9, 1997 No Month Data!.

| Structure | Resonance Mode | Position (wave numbers) | Reference |
|---|---|---|---|
| Si-O-Si Ring | Si-O Stretch | 1060-1080 | 1, 2, 3 |
| Si-O-Si Chain | Si-O Stretch; C-O Stretch | 1020-1060 | 1, 2, 3, 6 |
| Si-O | | 800-810 | 6 |
| | | | |
| Si-(CH3)3 | Si-C Deformation | 1260 | 1, 2, 3 |
| Si-(CH3)3 | Si-C Stretch | 840 | 1, 2, 4 |
| Si-(CH3)2 | Si-C Deformation | 1250 | |
| Si-(CH3)2 | Si-C Stretch | 802 and 888 | 1, 2, 4 |
| Si-CH3 | C-H vibration | 1410 | |
| -CH3 | C-H stretch | 2961 | 1, 2, 4 |
| C-H | Stretch | 2800-3000 | 6 |
| Si-H | Stretch | 2130, 2150-2250 | 4, 6 |
| R3 Si-H; where R=CH3-Si-O or CH3-O | Si-H | 2165 | 7 |
| Si-OH or SiH | | 900 | 4 |
| | | | |
| Si-OH | Bend | 925-930 | 6 |
| -OH | | 3650, 3350 | 6 |
| | | | |
| Si-CH2-CH2-Si | | 720 | 5 |
| Si-CH2-CH2-Si | Bending | 1400 | 8 |
| Si-CH2-CH2-Si | Deformation | 1410 | 8 |
| Si-CH2-Si | Bending | 1200-1260; 1360; 1400 | 1,2 |
| -CH2- (Alkane) | deformation | 1463, 2855, 2925 | 8 |
| C=O | Stretch | 1720 | 6 |

*FIG. 4a*

| Wavenumber | PROPOSED STRUCTURE |
|---|---|
| MAJOR PEAKS: | |
| 1026 | Si-O-Si chain |
| ~110 | Si-O-Si ring |
| 802 | Si-O or Si(CH3)2 |
| 1267 | Si(CH3)3 |
| | |
| MINOR PEAKS: | |
| ~850 | Si-(CH3)3 |
| 888 | Si-OH, Si-H or Si-(CH3)2 |
| 2962 | -CH3 or C-H |
| | |
| VERY MINOR OR MISSING PEAKS: | |
| 720 | Si-CH2-CH2-Si |
| 925-930 | Si-OH |
| 1200-1260 | Si-CH2-Si |
| 1360 | Si-CH2-Si |
| 1400 | Si-CH2-CH2-Si or Si-CH2-Si |
| 1410 | Si-CH3; Si-CH2-CH2-Si |
| 1463, 2885, 2925 | -CH2- (Alkane) |
| 1720 | C=O |
| 2165 | Si-H or R3 Si-H, where R=CH3-Si-O or CH3-O |
| 3650, 3350 | -OH |

*FIG. 4b*

METHOD OF MAKING LOW κ DIELECTRIC INORGANIC/ORGANIC HYBRID FILMS

This invention relates to materials having low dielectric constants. More specifically, the present invention relates to inorganic/organic hybrid films having low dielectric constant for use in semiconductors, produced using organosilicon precursors, and a method for making the same.

BACKGROUND OF THE INVENTION

One of the greatest challenges for the microelectronics industry in the coming years is to identify advanced dielectric materials that will replace silicon dioxide as an inter and intra metal layer dielectric. Dielectric film layers are fundamental components of integrated circuits and semiconductors. Such films provide electrical isolation between components. As device densities increase, multiple layer dielectric films are generally used to isolate device features. When forming dielectric films it is important for the film to exhibit certain properties, such as good gap fill, thermal stability and favorable electrical properties. The most widely used dielectric layer, silicon dioxide ($SiO_2$) is formed by a variety of methods. The most commonly used methods are chemical vapor deposition (CVD) and plasma CVD.

As device densities shrink, the gaps between lines become smaller, and the demands on dielectric films become more rigorous. When the critical feature size goes to less than 0.25 microns, the dielectric constant (κ) of the dielectric material acquires increasing importance. For example, as the industry moves to smaller interconnects and device features, the actual length of the interconnecting lines increases and the space between them decreases. These trends increase the RC delay of the circuit.

There are generally two ways to reduce the RC delay for a given geometry: (1) you can reduce the resistance of the interconnect lines by using different metals; or (2) you can reduce the dielectric constant by modifying or using different dielectric material.

Increased RC delay has a detrimental effect on the speed of the device, which has tremendous commercial implications. Further, narrower line spacing results in reduced efficiency due to the impact of higher capacitive losses and greater crosstalk. This reduced efficiency makes the device less attractive for certain applications such as battery powered computers, mobile phones, and other devices. Reducing the dielectric constant would have a favorable impact on capacitive loss and crosstalk. Thus, it is highly desirable to reduce the RC delay of the device.

Currently, devices may incorporate five or six dielectric layers, all comprised of silicon dioxide. Silicon dioxide ($SiO_2$) has a relatively high dielectric constant at about 4.0. Replacing $SiO_2$ with a suitable low dielectric constant (low κ) material will lead to a dramatic improvement in speed and reduction in the power consumption of the device. Such advanced low dielectric materials would play an important role in enabling the semiconductor industry to develop the next generation of devices.

A variety of materials have been investigated as low κ dielectric layers in the fabrication of semiconductors. Fluorine has been added to $SiO_2$ films in an attempt to lower the dielectric constant of the film. Stable fluorine doped $SiO_2$ formed by plasma CVD typically has a dielectric constant of 3.5 to 3.7; however, significantly lower κ values are desired.

Another plasma CVD approach to create low κ films is the deposition of highly crosslinked fluorocarbon films, commonly referred to as fluorinated amorphous carbons. The dielectric constant of the more promising versions of such films has generally been reported as between 2.5 to 3.0 after the first anneal. Issues for fluorinated amorphous carbon remain, most notably with adhesion; the thermal stability, including dimensional stability; and the integration of the films.

Polymeric materials have also been investigated. For example, spin coated polymeric materials have been employed. Despite their lower κ values, these polymers are not entirely satisfactory due to processing and material limitations. Polymers are generally thermally and dimensionally unstable at standard processing conditions of about 400° to 450° C. While these materials have been considered for embedded structures, as a rule they are not suitable for full stack gap fill or damascene structures.

Because of the disadvantages of spin-coated polymers, vapor phase polymerization has been explored as an alternative method for the preparation of low κ materials. One particular class of polymers which has been prepared through vapor phase polymerization are the polyxylylenes (also known as parylenes) such as parylene N (ppx—N), and parylene F (ppx—F). Parylenes have κ values ranging from 2.3 to 2.7 and are thus attractive as low dielectric materials for use in integrated circuits. However, the parylenes that have been prepared to date exhibit poor thermal stability as with ppx—N; expensive as with ppx—F, or have issues with mechanical stability.

To date, advanced low κ materials have not been successfully employed in the semiconductor industry. As such, there is continued interest in the identification of new materials, as well as methods for their fabrication, that have low κ values, high thermal stability, are fully manufacturable and result in reliable devices that are cost effective.

OBJECTS AND SUMMARY OF THE INVENTION

Accordingly, it is an object of the present invention to provide a dielectric material having a low dielectric constant.

More particularly, it is an object of the present invention to provide a dielectric film comprised of an inorganic/organic hybrid material having a low dielectric constant and good thermal stability for use in semiconductors and integrated circuits.

Another object of the present invention is to employ precursors of organosilicon, such as siloxanes, to form an inorganic/organic hybrid dielectric material having a low κ and good thermal stability for use in semiconductor and/or integrated circuit applications.

A further object of the present invention is to provide a method of depositing a dielectric layer for use in semiconductor and integrated circuit application having an inorganic/organic hybrid material with a low dielectric constant.

These and other objects and advantages are achieved by an improved dielectric film of the present invention, having a low dielectric constant, formed as a film in a semiconductor and/or integrated circuit and comprised of a combination of inorganic and organic functionality. More specifically, the film is formed of a backbone structure made substantially of Si—O—Si and organic side groups attached to the backbone structure. In an alternative embodiment, the film is formed of a backbone structure made substantially of Si—N—Si groups and organic side groups attached to the backbone structure.

In another embodiment of the present invention, organosilicon precursors are used to form a dielectric film for use in semiconductors and/or integrated circuits having a backbone comprised of substantially Si—O—Si or Si—N—Si groups and organic side groups.

In yet another embodiment of the present invention, a method of depositing a dielectric film in a semiconductor and/or integrated circuit by chemical vapor deposition (CVD) is provided. The film is deposited in a manner such that the film is comprised of a backbone made substantially of Si—O—Si or Si—N—Si groups with organic side groups attached to the backbone.

In still another embodiment of the present invention, a method of fabricating a film having multiple layers is provided. The method comprises the steps of forming a film comprised of: at least one low κ dielectric layer in the semiconductor or integrated circuit device having a combination of inorganic and organic materials and exhibiting a low dielectric constant, and forming insitu at least one oxide layer either directly above and/or directly below each low κ dielectric layer to form the multilayered film. The oxide layer may be formed insitu by simply varying the process conditions.

BRIEF DESCRIPTION OF THE DRAWINGS

Other objects and advantages of the invention become apparent upon reading of the detailed description of the invention provided below and upon reference to the drawings, in which:

FIG. 4a is a table illustrating FTIR peak ranges and their assignments according to the literature.

FIG. 4b is a table showing one interpretation of an FTIR plot of a film in accordance with the present invention.

DESCRIPTION OF THE SPECIFIC EMBODIMENTS

Low dielectric constant (κ) films for use in the semiconductor industry, and their method of fabrication, are provided. The term "low κ dielectric," "low dielectric constant," and "low κ" are used interchangeably and typically mean a dielectric constant of less than 4.0. The term "very low dielectric constant" (vlκ) is typically considered to be a dielectric constant of equal to or less than 3.0. According to the present invention, low κ and very low κ dielectric films are comprised of a combination of inorganic and organic properties. More particularly, the inorganic/organic hybrid films are comprised of silicon, oxygen and/or nitrogen, carbon and hydrogen; or alternatively silicon, oxygen and or nitrogen, carbon and fluorine. The structure of the film is of randomly mixed organic and inorganic groups. The groups may be cross linked. The groups may be present in a three dimensional matrix. Preferably, the film is formed having a backbone structure made substantially of inorganic Si—O—Si groups, with organic side groups attached to the backbone. In an alternative embodiment, the film is formed of a backbone structure made substantially of Si—N—Si groups and organic side groups attached to the backbone structure. Most preferably the backbone is present in a three dimensional network with cyclic Si—O—Si groups connected by inorganic chains, to form a ring (or other three dimensional structure such as a ball, cube and the like) and chain structure. The inorganic chains may be comprised substantially of Si—O—Si groups, or alternatively, of Si—N—Si groups. The inorganic chains may vary in length and composition. Organic side groups are attached to either, or both of, the cyclic and chain groups.

In an alternative embodiment, the film is comprised of a series of siloxane chains (no cyclic groups) with organic side groups attached. The chains may be cross linked. The organic side groups recited above are generally comprised of carbon chains. More specifically, the organic side groups are selected from the group consisting of aliphatic, olefinic and aromatic hydrocarbons, and aliphatic, olefinic and aromatic fluorocarbons. The side groups do not have to be comprised of identical units, but may be a combination of different organic groups. Preferably the organic side groups are comprised substantially of methyl ($CH_3$) or carbon tri fluoride ($CF_3$) groups.

Figure 1:
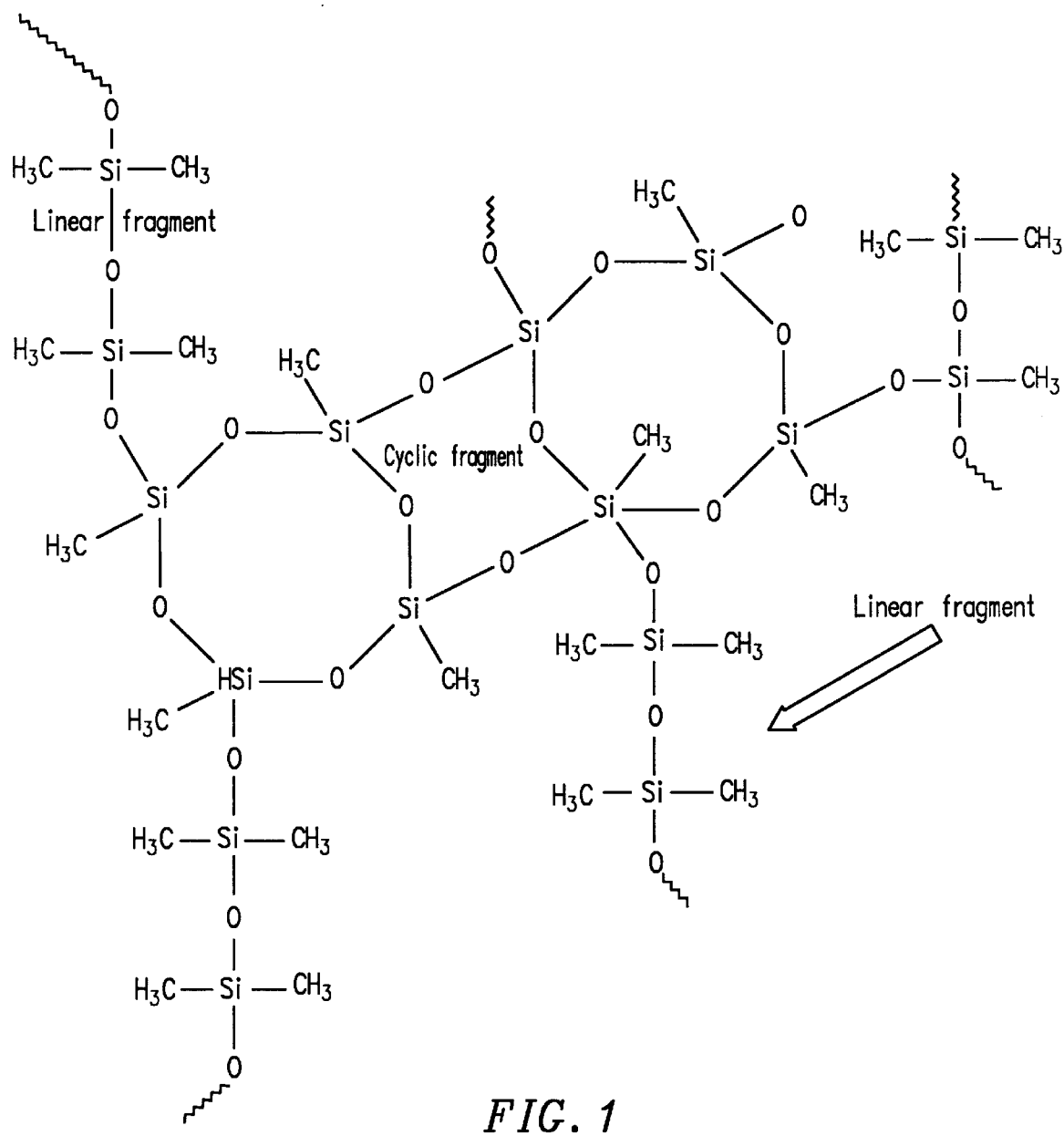
FIG. 1 is a schematic drawing of the structure of the film in accordance with one embodiment of the present invention.

Referring to FIG. 1, an exemplary embodiment of a portion of the low κ film of the present invention is shown. In this example the ring and chain structure is shown. The ring is the cyclic component which in this example is comprised of four silicon atoms. The rings are connected by inorganic chains. The chains may vary in length, and in this example, the chains are Si—O—Si groups. As shown the backbone of the structure is comprised of Si—O—Si cyclic ring and chain groups. Organic side groups are attached to both the ring and chain groups, and in this example the organic side groups are comprised of methyl groups.

The structure of the film is a random network. Referring again to FIG. 1, only a portion of the film is shown. At each end, the structure continues and may be connected to more rings, long or short chains, or a combination of all of the above. Generally the ratio of silicon to carbon in the film is in the range of approximately 0.25:1 to 4:1. The density of silicon in the chain groups to silicon in the cyclic groups is estimated to be in the range of approximately 10:1 to 0.1:1.

In the preferred embodiment, the low κ film of the present invention will have a structure comprised of cyclic and chain groups. This mixture of cyclic and chain groups provides a significant advance over the prior art films. The inventors have found a method that preserves the presence of the cyclic units in the film, which lowers the dielectric constant of the film. Further, the inventors have found that minimizing the C—C bonding in the film structure, allows the addition of organic materials into the film without significantly adversely affecting the thermal stability of the film at temperatures of 450° C. As shown in FIG. 1 there is an absence of carbon to carbon bonding.

The films produced by the present invention exhibit desirable dielectric constants while maintaining good thermal stability. The dielectric constant of the film is less than 4.0, preferably less than 3.0, with a dielectric constant in the range of approximately less than 3.0 to 1.5 being most preferred. For example, films tested with a dielectric constant of 3.0 exhibit good thermal stability as measured by weight loss of less than 1% per 8 hours at 425° C. in a nitrogen environment.

To form the inorganic/organic hybrid film of the invention, organosilicon precursor chemistry is used, or alternatively, mixtures that contain an organosilicon precursor(s) may be used. In one embodiment, organosilicon precursors of the formula below may be used to form the film of the invention:

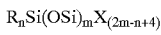

where n is 1 to (2m+4); m is 0 to 4; the organosilicon may be linear or branched; X is selected form the group consisting of H, and the halogens; and R is selected from the group consisting of aliphatic, olefinic and aromatic hydrocarbons, and aliphatic, olefinic and aromatic fluorocarbons, with and without an oxygen linkage. Examples of suitable aliphatic, olefinic, and aromatic hydrocarbon groups include methyl, ethyl, propyl, butyl, and phenyl, etc.

In another embodiment, the organosilicon precursor may be comprised of cyclic organosiloxanes of the formula:

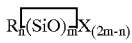

where n is 1 to 2m; m is 3 to 10; X is selected from the group consisting of H and the halogens; and R is selected from the group consisting of aliphatic, olefinic and aromatic hydrocarbons, and aliphatic, olefinic and aromatic fluorocarbons as listed above.

In yet another embodiment of the present invention, the organosilicon precursor is comprised of organosilazanes of the formula:

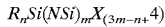

where the organosilazane may be linear or branched;, and n is 1 to (3m+4); m is 1 to 4; X is selected from the group consisting of H and the halogens; R is selected from the group consisting of aliphatic, olefinic and aromatic hydrocarbons, and aliphatic, olefinic and aromatic fluorocarbons.

In yet another embodiment of the invention, the organosilicon precursor is comprised of cyclic organosilazanes of the formula:

where n is 1 to 3m; m is 3 to 10; X is selected from the group consisting of H and the halogens; R is selected from the group consisting of aliphatic, olefinic and aromatic hydrocarbons, and aliphatic, olefinic and aromatic fluorocarbons.

Thus, suitable precursors according to the invention include: organic siloxanes, fluorosiloxanes, cyclosiloxanes, fluorine containing cyclosiloxanes, organosilazanes, fluorosilazanes, cyclosilazane, silicates, TEOS, and TMS and mixtures thereof. Examples of suitable side groups include: —H, —CH$_3$, —F, —C$_2$H$_5$, —CF$_3$, —C$_2$F$_5$, —C$_6$H$_5$, — C$_6$F$_5$, —CF$_2$CF$_3$, and C—H$_2$CF$_3$. Combinations of chemicals that when mixed in a reactor could create similar chemical constituents in final form as the aforementioned precursors, for example a mixture of: silane, silicon tetra fluoride and an organic precursor are also suitable.

Of particular advantage, the present invention provides for minimizing the fragmentation of the precursor, thus preserving the general structure deposited in the film. Thus, precursors with components that form a film structure having an inorganic backbone with organic side groups may be used. Accordingly, to form inorganic/organic hybrid films comprised of SiOC, in one embodiment of the present invention, it is preferred to deposit the films from organo-silicon precursors in a plasma CVD reactor. Fluorine substitutes of the above materials may also be used. The organosilicon precursors may be saturated or unsaturated. Examples of organosilicon precursors that are suitable according to the invention include hexamethyl disiloxane (HMDSO), 1,1,3,3-tetramethyldisiloxane (TMDSO) and the like. Other organosilicon precursors such as tetraethyoxysilane (TEOS) may also be used. The materials mentioned are generally inexpensive and readily available. These materials are volatile when heated and thus can be introduced into a plasma CVD reactor system.

In an alternative embodiment, the film of the invention having the ring and chain structure is formed by cyclic organosilicon or cyclic organosilazane precursors. The cyclic organosilicon or organosilazane may be substituted with one or more fluorine atoms. Further, they may be saturated or unsaturated. Examples of suitable cyclic organosilicons include: cyclosiloxanes such as octamethylcyclotetrasiloxane (OMCTS), hexa methyl cyclo trisiloxane, hexa phenyl cyclo trisiloxane, octa phenyl cyclo tetrasiloxane, 1,3,5-trimethyl- 1,3,5-tris-3,3,3-trifluoropropyl cyclo trisiloxane, fluorine containing cyclosiloxanes, and combinations of chemicals that create the same chemical components as above. Organosilazane precursors may also be used.

Most preferably, the precursor is octamethylcyclotetrasiloxane (OMCTS). Utilizing such a cyclic siloxane precursor is of particular advantage because as stated above the invention provides for the formation of a film that preserves part of the structure of the precursor. By preserving part of the structure of the cyclic precursor, the film is formed with a ring and chain structure which is a three dimensional network structure. This three dimensional network structure reduces the density of the film, which in turn further reduces the dielectric constant and increases the thermal stability of the film. It is important to note that while the three dimensional network structure is typically referred to herein as a ring, any three dimensional structure may be present, such as a ball or cube structure.

Fluorinated films can be formed by the present invention by adding fluorinating materials to the system. This can be accomplished in two ways. First, fluorinating gases can be added to the plasma in the reactor. Suitable fluorinating gases are NF$_3$, CF$_4$, SiF$_4$ and the like. Second, fluorinated precursors can be added to the reactor. For example, fluorosiloxane or cyclofluorosiloxane precursors can be used alone or can be mixed with linear or cyclic organosilicons or organosilazanes to form a fluorinated film.

To fabricate low κ dielectric films for the semiconductor industry, the present invention provides a method of depositing a low κ dielectric film comprised of both inorganic and organic nature for use in semiconductor and integrated circuit applications. The film is comprised of an inorganic backbone with organic side groups. The backbone may be linear, or comprised of a combination of three dimensional structures (such as a ring, ball, cube, and the like) and chains. The film is formed by chemical vapor deposition (CVD), and preferably the film is deposited by plasma CVD in a plasma CVD reactor. Of particular advantage, the present invention provides for an improved CVD method which is a method of depositing a film that retains, in part, the structure of the precursor material. When the precursor is cyclic in nature, the method of the present invention deposits a film that retains part of the cyclic structure of the precursor. As discussed above this is particularly advantageous since such a structure promotes low κ properties in the deposited film.

Figure 2:
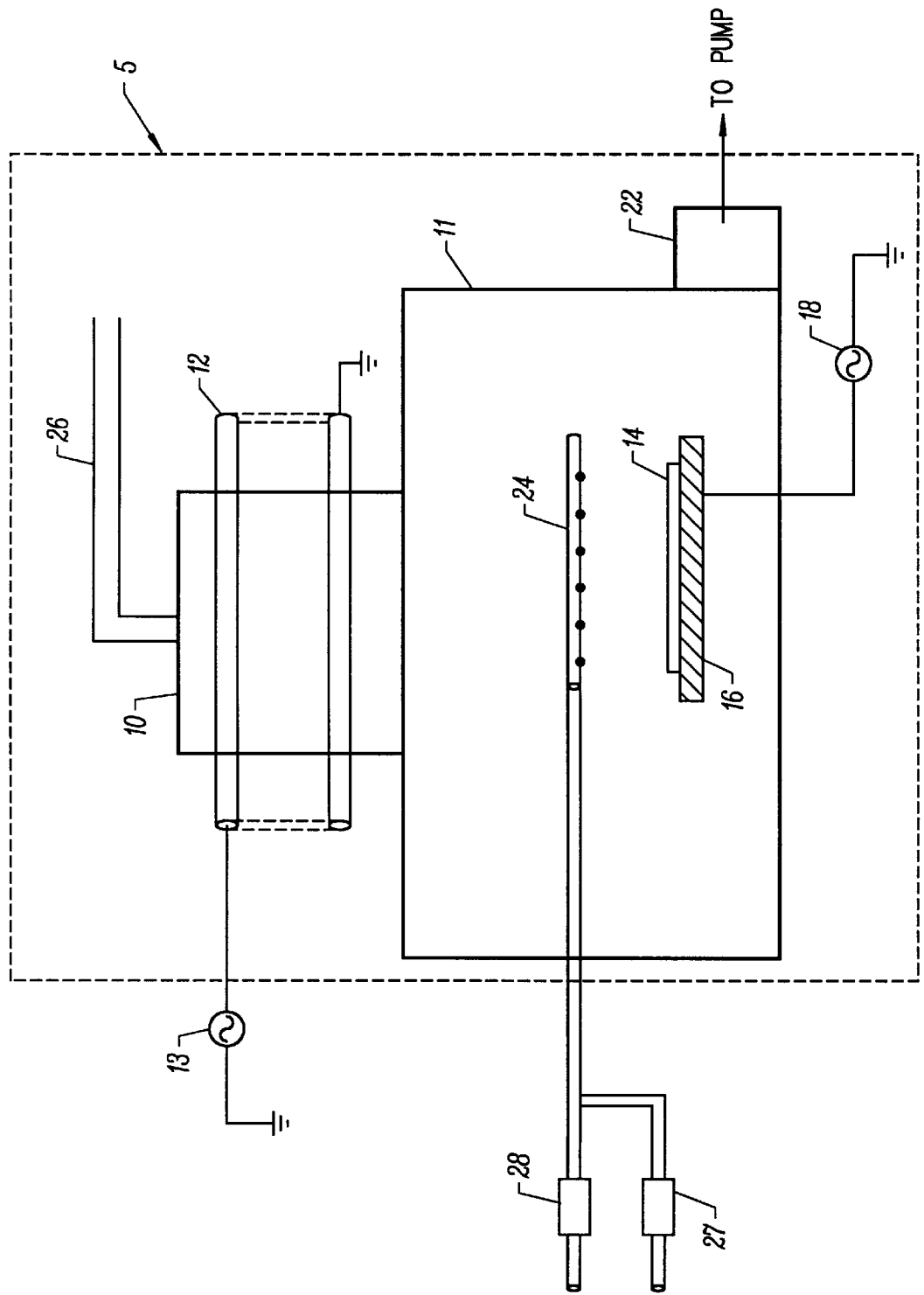
FIG. 2 is a schematic view showing an example of a reactor that may be used to carry out the present invention.

A variety of plasma CVD reactors may be used to practice the present invention. In an exemplary embodiment, a reactor such as that illustrated in FIG. 2 is employed to deposit the film of the present invention. As shown in FIG. 2 the reactor 5 includes a plasma chamber 10 and a process chamber 11. The plasma chamber 10 includes a plasma source 12 for coupling energy, ranging from d.c. to microwave, via generator 13 into the plasma chamber 10 to excite a gas into a plasma. In this illustration, the plasma source 12 is represented by a coil arranged around the plasma chamber 10 and energized with rf energy, however, it is to be understood by those of ordinary skill in the art that various types of plasma sources known in the art may be used to generate a plasma.

A substrate 14 is placed on a support 16 and is positioned in the process chamber 11. The support 16 may be biased by application of power through r.f. and/or d.c. generator 18. The support 16 may be an electrostatic chuck. The chambers 10 and 11 are evacuated through port 22. To form a film in the exemplary embodiment, the chemical precursors are injected into the process chamber 11 via gas inlet line 24. Alternatively, the precursors or other gases may be injected into the plasma chamber 10 via gas inlet 26. If the organosilicon precursors according to the present invention are present in liquid form under atmospheric conditions, the liquid is passed though a vaporizer 28 to vaporize the precursor prior to its introduction into the chamber 11. Alternatively, the liquid organosilicon precursor may be introduced into the chamber through a bubbler. Also, diluent gases and/or oxidizing gases may be added via inlet 27 to the reactor 5.

As the precursor is injected into the system the plasma source partially ionizes the precursor. It is important that the plasma conditions be controlled in such a manner that the precursor is not highly fragmented nor overly oxidized. This is in direct contrast to prior art CVD processes where one generally wants to fragment the precursor as much as possible when depositing a dielectric film. A high level of fragmentation of an organosilicon precursor will generally lead to the deposition of a silicon dioxide type material with a high dielectric constant. This is especially true if a certain concentration of oxygen is present in the plasma.

The semiconductor substrate is positioned in the process chamber where it is exposed to the precursor which reacts and deposits a film on the surface by CVD. Preferably the precursor will be injected into the process chamber proximate to the substrate surface, such as through a gas ring to enhance the uniformity of the deposited film.

The precursor may be a single chemical, or alternatively, a plurality of chemicals. It has been found that the addition of oxygen can enhance the thermal stability of the film. The exact concentration of oxygen added is dependent on processing conditions and the system configuration.

Generally, inert gases are not added to the system in contrast to prior art systems. It has been found that the addition of argon generally has a detrimental effect on the film. Argon ionizes to a high degree and causes the precursor to fragment. This in turn leads to films with higher dielectric constants. Conversely, the addition of helium has been found in some cases to have a dramatically reduced impact on the dielectric constant, and further may enhance the thermal stability of the film.

As stated above, the process conditions are important to depositing the film of the present invention. The factors of most importance are the power and pressure of the system, and the organosilicon flow rate, and the oxygen to organosilicon flow rate ratio. It is important to note that within the above teaching, the exact process conditions will vary depending on the type and design of the reactor used. In an exemplary embodiment of the invention, the plasma chamber includes a plasma source, and the excitation is at a power density in the range of 200 to 20,000 W/ft$^3$. The process conditions are strongly a function of the precursor employed and the design of the reactor. For example, in the case of a plasma system, low excitation power generally produces organic films and higher powers produce more thermally stable films. If the excitation power is too high, the film becomes $SiO_2$-like and the dielectric constant becomes too high. If the excitation power is too low then the thermal stability will be undesirably poor. Further when the power is too low, or the plasma chemistry has not been properly determined, it is possible under some circumstances to create undesirable groups in the films. Under such conditions peaks associated with Si—OH have been observed in the FTIR spectra and the dielectric constant is higher than desired. Also, the role of oxygen in the process is to improve the thermal stability of the film. The amount of oxygen will vary depending on the reactor and process conditions used. For example, the percent concentration of oxygen used is a function of the process conditions, such as the rf power, pressure, and the flow rate of the organosilicon precursor. Too much oxygen will result in a film that is a $SiO_2$-like material. Too little oxygen generally results in a film with more organic nature than desirable, which lowers the thermal stability of the film and may result in the formation of undesirable groups in the film such as —OH.

Although one type of reactor has been described, it will be understood to those skilled in the art that different types of reactors may be employed to deposit the film of the present invention. For example, thermal CVD reactors may be used that operate at either atmospheric pressure, sub-atmospheric pressure or at low pressure conditions. In a thermal CVD system, the organosilicon is degraded thermally in the presence of an oxidizing agent. Control of the chamber temperature, the nature of the oxidizing agent (such as ozone, hydrogen peroxide, and/or oxygen), and the concentration of the oxidizing agent is fundamental for producing low κ films.

In the fabrication of semiconductors and integrated circuits devices, another embodiment of the present invention provides for a method of fabricating a film having multiple layers. It may be advantageous in certain applications to provide a film that has multiple layers where an oxide (such as $SiO_2$ or $SiO_2$-like) is formed along with a low κ dielectric film to form the multilayered film. The oxide layer can be formed above or below the low κ, dielectric layer to provide a protective layer, or to improve adhesion. According to the invention, at least one oxide, or oxide like layer is formed insitu either directly above and/or directly below a low κ dielectric layer. The low κ dielectric layer is comprised of a combination of inorganic and organic materials. The low κ dielectric film is as formed as described above. The layer of oxide or silicon dioxide may be formed insitu by simply varying the process conditions in the reactor. The process conditions can be employed in two ways. First, a $SiO_2$ deposition process as known in the art can be used. Second, the method of the present invention can be varied to cause substantial fragmentation of the precursor to occur which results in a $SiO_2$ or $SiO_2$ type film to de deposited. The method can be varied to cause substantial fragmentation of the precursor in a number of ways, such as by exposing the precursor to a higher plasma power density, by increasing the flow rate of oxygen, by adding argon, or by a combination of any of the same.

As stated above the $SiO_2$ layer can be formed at any suitable position within the multilayered film. The multilayered film is then formed at any suitable position within a semiconductor device. For example, the $SiO_2$ layer can be formed directly below the desired low κ film to improve the adhesion properties, with the low κ film being formed directly atop the $SiO_2$ layer. Alternatively, the $SiO_2$ layer can be formed as the top layer in a device to provide a protective layer, or to aid in further processing such as chemical mechanical planarization or etching.

EXPERIMENTAL

The following examples are offered by way of illustration and not by way of limitation.

EXAMPLE 1

A very low κ dielectric film according the present invention was formed on a 4" silicon wafer in a cylindrical plasma reactor using octamethylcyclotetrasiloxane (OMCTS) and oxygen combined in a plasma discharge generated at a frequency of 13.56 MHz. The silicon wafer was placed on a substrate holder made of copper which was electrically isolated during the deposition process. The wafer was secured onto the substrate holder with a vacuum compatible adhesive and placed into the deposition chamber. The deposition chamber was 8" in diameter and 8" in length and contains a hollow cathode electrode system which was centered to the center of the silicon wafer. The chamber was evacuated with a rotary vane pump to a pressure less than 20 mTorr. Once the chamber was evacuated, the OMCTS liquid was injected into a heated stainless steel vaporizing system which vaporized the material to form a vapor stream which was then controllably flowed into the plasma reactor at a flow rate of approximately 8 sccm (standard cubic centimeters per minute). After the OMCTS flow was stable, oxygen gas (from a compressed gas cylinder with a purity of 99.95%) was controllably flowed into the reactor through the same gas inlet as the OMCTS at 5 sccm. The resulting pressure in the reactor was approximately 150 mTorr. A plasma was then ignited with 300 watts of power with a 13.56 MHz power supply and the plasma discharge was maintained for approximately 5 minutes, during which time, a film was deposited on the surface of the wafer. The film was deposited to a thickness of 5000 Å. The film was measured using elipsometry to measure thickness, and using aluminum dot techniques to measure the dielectric constant. The tests yielded a dielectric constant of 2.6. Additional films in accordance with the invention were deposited on wafers under the same conditions and procedure as outlined above, and then measured for thermal weight loss by heating at 400° C. for 1 hour. The films exhibited a loss of 2.0 weight %. The films subsequently underwent a thermal cycle of 1 hour at 425° C. and 1 hour at 450° C. The weight loss in each instance was approximately 0.4% per hour, thereby indicating a desirable dielectric constant and thermal stability.

EXAMPLE 2

In a second set of experiments, low κ dielectric films were deposited in accordance with another embodiment of the inventive method where the flow rate of the precursors and the plasma conditions were changed. The reactor used was identical to that described in Example 1 above and the same precursors were used, however, in this experiment the flow rate of oxygen was approximately 2.5 sccm. The flow rate of OMCTS was the same at approximately 8 sccm. The plasma conditions were also different, and in this case the plasma was ignited with 275 watts of power with a 13.56 MHz power supply and the plasma discharge was maintained for approximately 5 minutes. The resulting 5000 Å thick film was measured with a standard aluminum dot capacitance test method and yielded a dielectric constant of 3.3. Additional films in accordance with the invention were deposited on wafers under the same conditions and procedure as outlined above, and then measured for thermal weight loss by heating at 400° C. for 1 hour. The films exhibited a loss of 0.3 weight %. Subsequent cycles at 425° C. (for 1 hour) and 450° C. (for 1 hour) resulted in a weight loss of 0.3% and 0.4% respectively, again indicating desirable dielectric constant and thermal stability.

EXAMPLE 3

In a third set of experiments, very low κ dielectric films were deposited in accordance with another embodiment of the present invention. In this set of experiments, a Watkins-Johnson Company HDP cluster tool reactor Model number WJ-2000H (having an inductively coupled plasma source) was used to deposit a low κ film on an 8-inch silicon wafer under the following conditions: vaporized OMCTS was injected into the reactor at a liquid flow rate of 0.300 ccm (measured at room temperature). Additionally, oxygen was added at a flow rate of 20 sccm. The plasma source was operated at an RF input power of approximately 600 Watts (a power density of 1200 Watts/ft$^3$) at a frequency of 13.56 MHz. The resulting pressure in the reactor was approximately 25 mTorr. Films were deposited under two different process times; approximately 2 minutes 45 seconds, and 6 minutes 30 seconds. The shorter process time yielded a film of approximately 5000 Å thickness as measured by clipsometry. The dielectric constant of this film was measured using the Hg probe technique at 1 MHz, and found to be 2.97. The films were then measured for thermal stability by thermogravimetric analysis (TGA) for weight loss in a nitrogen environment. The thicker films (deposited at the longer process time) exhibited a weight loss of 3.65% when heated at 10° C. per minute from ambient to 425° C., then held at 425° C. for 140 minutes, and then cooled back to ambient temperature. Such results indicate desirable dielectric constant and thermal stability.

Figure 3:
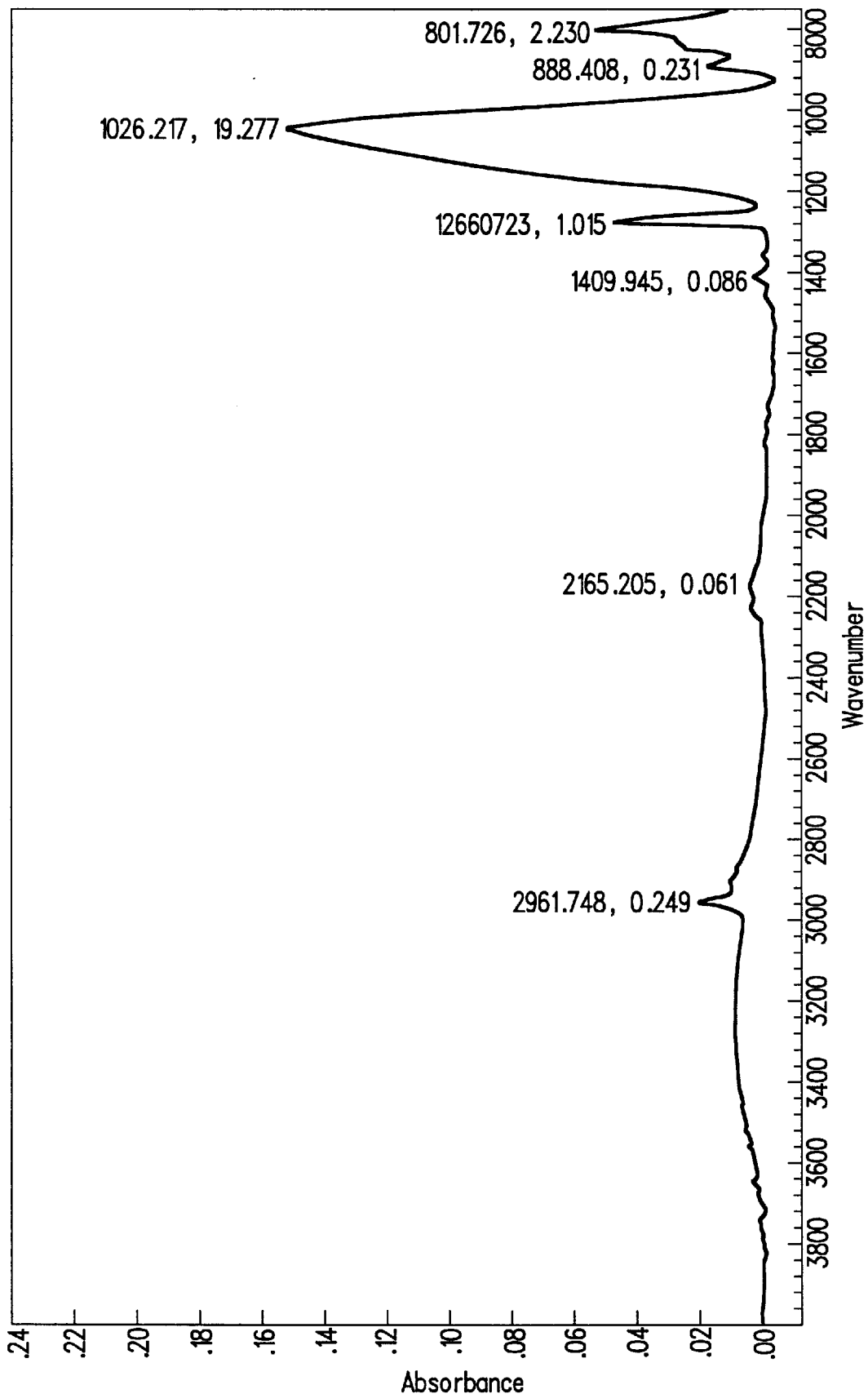
FIG. 3 is a FTIR scan showing the composition of a film in accordance with one embodiment of the present invention.

FIG. 3 illustrates the Fourier transform infrared absorption (FTIR) spectrum for a dielectric layer comprised of inorganic and organic materials in accordance with the present invention. As a reference, FIG. 4a is a table illustrating FTIR peak ranges and their assignments according to the literature. While interpretation of FTIR spectrum is not an exact science, the inventors believe that the absorption peaks depicted in FTIR scans of films of the present invention correspond to the structure shown in FIG. 4b.

As shown in the FTIR spectrum and with reference to FIGS. 4a and the interpretation in FIG. 4b, the film of the present invention does not exhibit appreciable carbon-carbon bonding. The FTIR spectrum and FIGS. 4a and 4b further show the predominant presence of the organosilicon backbone, with the Si—O—Si cyclic structure at wave numbers of approximately 1060–1080 cm$^{-1}$, with a shoulder at approximately 1080 cm$^{-1}$; and the Si—O—Si chain at wave numbers of approximately 1020–1060 cm$^{-1}$, with a major peak at 1026 cm$^{-1}$. In this illustration, the organic side groups are shown predominately at 1265 cm$^{-1}$ and 888 cm$^{-1}$ and are comprised of Si—(CH$_3$)$_3$ and Si(CH$_3$)$_2$, respectively. While the FTIR spectrum for one example is shown, it should be understood that the FTIR spectrum will vary and still fall within the teaching of the present invention.

Thus, an improved dielectric film comprised of an inorganic/organic hybrid material having a low dielectric constant for use in semiconductors and integrated circuits has been provided. Inventive precursor chemistry and deposition methods have also been provided. The films exhibit low dielectric constants in the range of approximately 1.5 to 4.0, high thermal stability, and are fully manufacturable with reliable device yields.

While the invention has been described in connection with specific embodiments it is evident that many variations, substitutions, alternatives and modifications will be apparent to those skilled in the art in light of the foregoing description and teaching. Accordingly, this description is intended to encompass all such variations, substitutions, alternatives and modifications as fall within the spirit of the appended claims.

We claim:

1. A method of fabricating a dielectric film on a semiconductor or integrated circuit having a low dielectric constant comprising the steps of:

providing at least one organosilicon precursor;
   depositing by chemical vapor deposition where said precursor reacts and deposits said dielectric film on the surface of a substrate;
   wherein said precursor is not significantly fragmented to form said dielectric film with a backbone structure comprised substantially of inorganic groups and organic side groups attached to said backbone structure to form a hybrid of inorganic and organic materials that provide said film having a dielectric constant of less than 4.0 and exhibiting weight loss of less than 2% per hour at 400° C. in nitrogen.

2. The method of claim 1 wherein the step of depositing is by plasma chemical vapor deposition.

3. The method of claim 1 wherein said dielectric film has a dielectric constant less than 3.0.

4. The method of claim 1 wherein the backbone structure is further comprised substantially of cyclic Si—O—Si groups and chains.

5. The method of claim 1 wherein the backbone structure is further comprised substantially of cyclic Si—N—Si groups and inorganic chains.

6. The method of claim 4 wherein the cyclic groups are comprised of rings, balls, cubes, or any combination thereof.

7. The method of claim 1 wherein the precursor is a cyclic organosilicon.

8. The method of claim 1 wherein the precursor is selected form the group consisting of siloxanes, fluorosiloxanes, cyclosiloxanes, fluorine containing cyclosiloxanes, organosilazanes, fluorosilazanes, cyclic organosilazanes, cyclo fluorosilazanes, and mixtures thereof.

9. The method of claim 1 wherein the precursor has the formula of:

$$R_nSi(OSi)_mX_{(2m-n+4)}$$

where the precursor is linear or branched and; n is 1 to (2m+4); m is 0 to 4; X is selected from the group consisting of H and the halogens; and R is selected from the group consisting of aliphatic, olefinic and aromatic hydrocarbons, and aliphatic, olefinic and aromatic fluorocarbons.

10. The method of claim 1 wherein the precursor has the formula of:

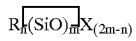$(SiO)_mX_{(2m-n)}$ where n is 1 to 2m; m is 3 to 10; X is selected from the group consisting of H and the halogens; and R is selected from the group consisting of aliphatic, olefinic and aromatic hydrocarbons, and aliphatic, olefinic and aromatic fluorocarbons.

11. The method of claim 1, wherein the precursor has the formula of:

$$R_nSi(NSi)_mX_{(3m-n+4)}$$

where the precursor is linear or branched; and n is 1 to (3m+4); m is 1 to 4; X is selected from the group consisting of H and the halogens; and R is selected from the group consisting of aliphatic, olefinic and aromatic hydrocarbons, and aliphatic, olefinic and aromatic fluorocarbons.

12. The method of claim 1 wherein the precursor has the formula of:

$(SiN)_mX_{(3m-n)}$ where n is 1 to 3m; m is 3 to 10; X is selected from the group consisting of H and the halogens; and R is selected from the group consisting of aliphatic, olefinic and aromatic hydrocarbons, and aliphatic, olefinic and aromatic fluorocarbons.

13. The method of claim 1 wherein the precursor is octamethylcyclotetrasiloxane.

14. The method of claim 1 wherein the organic side groups contain carbon atoms and the carbon to carbon bonding in said organic side groups is minimized.

15. The method of claim 1 further comprising the step of: providing oxygen gas mixed with said precursor.

16. The method of claim 1 further comprising the step of: depositing at least one layer of silicon oxide insitu either atop of and/or below said dielectric film to form a film having multiple layers.

17. The method of claim 1 where the organosilicon precursor is a cyclic siloxane selected from the group consisting of octamethylcyclotetrasiloxane (OMCTS), hexa methyl cyclo trisiloxane, hexa phenyl cyclo trisiloxane, octa phenyl cyclo tetrasiloxane, 1,3,5-trimethyl-1,3,5-tris-3,3,3-trifluoropropyl cyclo trisiloxane, fluorine containing cyclosiloxanes, and combinations thereof.

18. A method of depositing a low dielectric film on a semiconductor or integrated circuit by plasma chemical vapor deposition, comprising the steps of:

positioning a substrate within a process chamber;
   injecting at least one organosilicon precursor into said process chamber;
   applying power into said process chamber to generate a plasma;
   depositing said dielectric film on the surface of the substrate wherein the structure of the dielectric film retains in part the structure of the precursor, said dielectric film having a backbone structure comprised substantially of cyclic and linear Si—O—Si groups and organic side groups attached to said backbone structure that provide said film having a dielectric constant of less than 4.0 and exhibiting weight loss of less than 2% per hour at 400° C. in nitrogen.

19. The method of claim 18 wherein said dielectric film has a dielectric constant less than 3.0.

20. The method of claim 18 wherein the precursor is a cyclic organosilicon.

21. The method of claim 18 wherein the precursor is selected from the group consisting of siloxanes, fluorosiloxanes, cyclosiloxanes, fluorine containing cyclosiloxanes, organosilazanes, cyclo silazanes, fluorosilazanes, cyclofluorosilazanes and mixtures thereof.

22. The method of claim 18 wherein the precursor has the formula of:

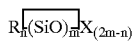

where n is 1 to 2m; m is 3 to 10; X is selected from the group consisting of H and the halogens; nd R is selected from the group consisting of aliphatic, olefinic and aromatic hydrocarbons, and aliphatic, olefinic and aromatic fluorocarbons.

23. The method of claim 18 wherein the precursor has the formula of:

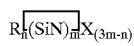

where n is 1 to 3m; m is 3 to 10; X is selected from the group consisting of H and the halogens; and R is selected from the group consisting of aliphatic, olefinic and aromatic hydrocarbons, and aliphatic, olefinic and aromatic fluorocarbons.

24. The method of claim 18 wherein the precursor is octamethylcyclotetrasiloxane.

25. The method of claim 18 wherein said plasma chamber includes a plasma source, and the exposing further comprising exposing the precursor to said plasma at a power density in the range of 200 to 20,000 W/ft$^3$.

26. The method of claim 18 further comprising the step of:
depositing at least one layer of silicon oxide insitu either atop of and/or below said dielectric film to form a film having multiple layers.

27. The method of claim 18 wherein the organic side groups contain carbon atoms and the carbon to carbon bonding in said organic side groups is minimized.

28. The method of claim 18 further comprising the step of:
providing oxygen gas mixed with said organosilicon precursor.

29. The method of claim 18 further comprising the step of:
introducing a diluent gas into said process chamber.

30. The method of claim 18 further comprising the step of:
introducing helium into said process chamber.

31. The method of claim 18 wherein the ratio of the Si in the inorganic chains to Si in the cyclic Si—O—Si groups is in the range of approximately 10:1 to 0.1:1.

32. The method of claim 18 wherein said dielectric film has a backbone structure comprised substantially of cyclic and linear Si—N—Si groups and organic side groups attached to said backbone structure.

33. The method of claim 18 wherein the cyclic groups are comprised of rings, balls, cubes, or any combination thereof.

34. The method of claim 18 where the organosilicon precursor is a cyclic siloxane selected from the group consisting of octamethylcyclotetrasiloxane (OMCTS), hexa methyl cyclo trisiloxane, hexa phenyl cyclo trisiloxane, octa phenyl cyclo tetrasiloxane, 1,3,5-trimethyl-1,3,5-tris-3,3,3-trifluoropropyl cyclo trisiloxane, fluorine containing cyclosiloxanes, and combinations thereof.

* * * * *